(12) United States Patent
Hu

(10) Patent No.: US 11,018,082 B2
(45) Date of Patent: May 25, 2021

(54) SPACE TRANSFORMER AND MANUFACTURING METHOD THEREOF

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 62 days.

(21) Appl. No.: 16/505,736

(22) Filed: Jul. 9, 2019

(65) Prior Publication Data
US 2020/0033381 A1    Jan. 30, 2020

Related U.S. Application Data

(60) Provisional application No. 62/711,628, filed on Jul. 30, 2018.

(51) Int. Cl.
| | | |
|---|---|---|
| *G01R 1/073* | (2006.01) | |
| *H01L 23/498* | (2006.01) | |
| *H01L 21/48* | (2006.01) | |
| *H01L 23/00* | (2006.01) | |
| *H01L 23/48* | (2006.01) | |

(Continued)

(52) U.S. Cl.
CPC .... *H01L 23/49827* (2013.01); *G01R 1/07378* (2013.01); *G01R 31/2601* (2013.01); *H01L 21/486* (2013.01); *H01L 21/4853* (2013.01); *H01L 23/481* (2013.01); *H01L 23/49838* (2013.01); *H01L 23/5384* (2013.01); *H01L 24/08* (2013.01); *H05K 1/114* (2013.01); *H05K 3/4007* (2013.01); *H05K 3/429* (2013.01); *H01L 2224/02372* (2013.01); *H01L 2224/02373* (2013.01)

(58) Field of Classification Search
CPC ........... G01R 1/07378; G01R 31/2601; H05K 1/114; H05K 3/4007; H05K 3/429
USPC ....................................... 324/754.07
See application file for complete search history.

(56) References Cited

U.S. PATENT DOCUMENTS

| | | | | |
|---|---|---|---|---|
| 8,803,545 B2 * | 8/2014 | Yoko | ...................... | G11C 29/02 |
| | | | | 324/762.06 |
| 9,543,249 B1 * | 1/2017 | Hu | ...................... | H01L 23/5384 |

(Continued)

FOREIGN PATENT DOCUMENTS

| | | |
|---|---|---|
| TW | M521177 | 5/2016 |
| TW | 201805636 | 2/2018 |
| TW | I621194 | 4/2018 |

*Primary Examiner* — Tung X Nguyen
*Assistant Examiner* — Robert P Alejnikov, Jr.
(74) *Attorney, Agent, or Firm* — JCIPRNET

(57) ABSTRACT

A space transformer for connecting a signal source and probing a semiconductor wafer and a manufacturing method thereof are provided. The space transformer includes a circuit board, a redistribution structure bonded to the circuit board, and a conductive through via providing a vertical conductive path therebetween. The circuit board includes a wiring structure which includes alternately stacked dielectric layers and patterned wiring layers, and first contact pads of the patterned wiring layers connect the signal source. The redistribution structure is thinner than the circuit board and includes second contact pads for probing the semiconductor wafer. A pitch of adjacent second contact pads is finer than that of adjacent first contact pads. The conductive through via penetrates through the circuit board, and the conductive through via is laterally covered by the dielectric layers and is laterally and physically in contact with the patterned wiring layers.

12 Claims, 10 Drawing Sheets

(51) Int. Cl.
  *H01L 23/538*    (2006.01)
  *G01R 31/26*     (2020.01)
  *H05K 1/11*      (2006.01)
  *H05K 3/40*      (2006.01)
  *H05K 3/42*      (2006.01)

(56) References Cited

U.S. PATENT DOCUMENTS

| | | | |
|---|---|---|---|
| 9,594,114 B2* | 3/2017 | Sinsheimer | G01R 31/31905 |
| 2008/0284037 A1* | 11/2008 | Andry | H01L 21/76898 |
| | | | 257/774 |
| 2010/0243299 A1* | 9/2010 | Kariya | H01L 23/5384 |
| | | | 174/255 |
| 2014/0253165 A1* | 9/2014 | Kim | G01R 1/07378 |
| | | | 324/756.03 |
| 2016/0141262 A1* | 5/2016 | Hu | H01L 21/6835 |
| | | | 257/738 |
| 2017/0062383 A1* | 3/2017 | Yee | H01L 25/18 |
| 2017/0125347 A1* | 5/2017 | Hu | H01L 24/02 |
| 2017/0343582 A1* | 11/2017 | Yang | G01R 1/07378 |
| 2018/0166371 A1* | 6/2018 | Hu | H01L 21/4853 |

* cited by examiner

SPACE TRANSFORMER AND MANUFACTURING METHOD THEREOF

CROSS REFERENCE TO RELATED APPLICATION

This application claims the priority benefit of U.S. provisional application Ser. No. 62/711,628, filed on Jul. 30, 2018. The entirety of the above-mentioned patent application is hereby incorporated by reference herein and made a part of specification.

BACKGROUND OF THE INVENTION

1. Field of the Invention

The present invention relates to a space transformer, and more specifically relates to a space transformer for connecting a signal source and probing a semiconductor wafer.

2. Description of Related Art

As the electronic industry has rapidly developed, the trend in semiconductor dies has been to gradually move toward miniaturization and integration. The testing pad pitches of highly integrated semiconductor die has become narrower, whereas the degree to which a device for probing or testing such highly integrated semiconductor dies can have a fine pitch is limited. In this respect, a space transformer to support fine testing pad pitches of high integrated semiconductor die is desired in the field.

SUMMARY OF THE INVENTION

The invention provides a space transformer and a manufacturing method thereof. The space transformer configured to connect a signal source and probe a semiconductor wafer provides a fine circuitry side for mating with the probe pins and a coarse circuitry side for mating with the signal source, thereby simplifying of a structure of test probe apparatus and increasing manufacturing efficiency of a space transformer.

The invention provides a space transformer. The space transformer includes a circuit board including a wiring structure, a redistribution structure bonded to the circuit board and including second contact pads configured to probe the semiconductor wafer, a conductive through via penetrating through the circuit board and providing a vertical conductive path between the circuit board and redistribution structure. A plurality of first contact pads of the wiring structure is configured to connect the signal source. The redistribution structure is thinner than the circuit board, wherein a pitch of the adjacent second contact pads is finer than that of the adjacent first contact pads.

In some embodiments, the redistribution structure further includes a patterned dielectric layer having an outer surface substantially leveled with outer surfaces of the second contact pads. In some embodiments, the wiring structure of the circuit board includes a first conductive via connected to the first contact pads, the redistribution structure includes a second conductive via connected to the second contact pads, and a dimension of the first conductive via of the circuit board is greater than that of the second conductive via of the redistribution structure. In some embodiments, a width of the second conductive via of the redistribution structure increases in a direction toward the circuit board. In some embodiments, the conductive through via extends through the bonding layer to be in contact with the redistribution structure. In some embodiments, the conductive through via extends through the redistribution structure.

The invention further provides a manufacturing method of a space transformer. The method includes at least the following steps. A circuit board is bonded to a redistribution structure through a bonding layer, where a plurality of first contact pads of the circuit board is formed according to a first design rule and a plurality of second contact pads of the redistribution structure is formed according a second design rule, a dimension of each of the first contact pads is greater than a dimension of each of the second contact pads, the first contact pads of the circuit board are configured to connect the signal source, and the second contact pads of the redistribution structure are configured to probe the semiconductor wafer. The redistribution structure is electrically coupled to the circuit board by a vertical conductive path between the circuit board and redistribution structure.

In some embodiments, the step of electrically coupling the redistribution structure to the circuit board includes: after bonding the circuit board to the redistribution structure, forming a through hole on the circuit board, the bonding layer, and the redistribution structure; and forming a conductive material in the through hole to form the vertical conductive path between the circuit board and redistribution structure. In some embodiments, the step of electrically coupling the redistribution structure to the circuit board includes: after bonding the circuit board to the redistribution structure, forming a blind hole on the circuit board and the bonding layer to expose at least a portion of the redistribution structure; and forming a conductive material in the blind hole to be in contact with the portion of the redistribution structure so as to form the vertical conductive path between the circuit board and redistribution structure. In some embodiments, the step of electrically coupling the redistribution structure to the circuit board includes: providing the circuit board with a conductive through via formed therein before bonding the circuit board to the redistribution structure, wherein after bonding the circuit board to the redistribution structure, the conductive through via is electrically connected to the redistribution structure. In some embodiments, the method further includes: forming the second contact pads of the redistribution structure and a patterned dielectric layer of the redistribution structure on a temporary carrier; and after bonding the circuit board to the redistribution structure, removing the temporary carrier to expose the second contact pads and the patterned dielectric layer, wherein exposed surfaces of the second contact pads and the patterned dielectric layer are substantially leveled.

Based on the above, the space transformer includes the fine contact pads of the redistribution structure formed according to the IC design rules such that the probe side of the space transformer can meet the requirements of fine-pitch spacing of the testing probes which are used to probe or test the semiconductor wafer. The space transformer further includes the coarse contact pads of the circuit board formed according to the PCB design rules such that the signal source side of the space transformer can mate with the testing PCB for transmitting the signal to the probe side. In addition, the conductive through vias provide vertical conductive paths in the space transformer, thereby shortening signal length and minimizing a noise between operations so as to improve a signal performance of the testing apparatus.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
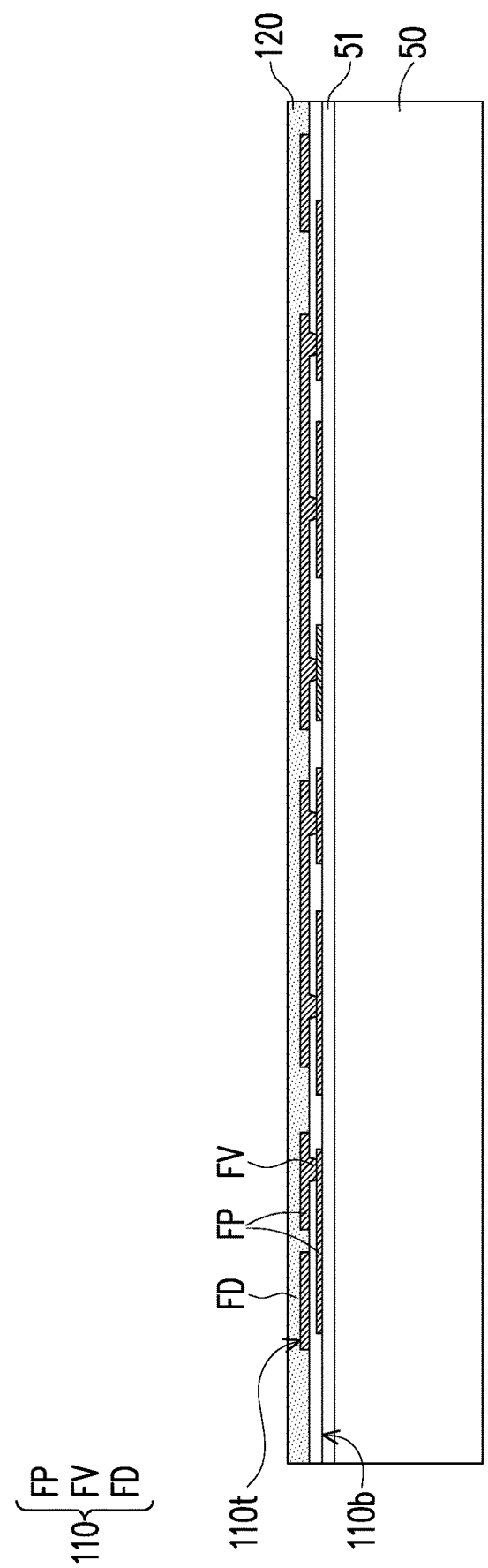
FIG. 1A to FIG. 1D are schematic cross-sectional views illustrating a manufacturing method of a space transformer according to some embodiments of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1D are schematic cross-sectional views illustrating a manufacturing method of a space transformer according to some embodiments of the invention. Referring to FIG. 1A, a redistribution structure 110 is formed over a temporary carrier 50 and a bonding layer 120 is formed over the redistribution structure 110. The temporary carrier 50 may be made of glass, plastic, silicon, metal, or other suitable materials as long as the material is able to withstand the subsequent processes while carrying a structure formed thereon. In some embodiments, a release layer 51 (e.g., a light to heat conversion film, or other suitable de-bonding layer) may be applied on a top surface of the temporary carrier 50 to enhance the releasability of the redistribution structure 110 from the temporary carrier 50 in a subsequent process.

In some embodiments, the redistribution structure 110 including a fine conductive pattern FP, a fine dielectric layer FD, and a fine conductive via FV is formed over the temporary carrier 50. A material of the fine dielectric layer FD may include polyimide (PI), benzocyclobutene (BCB), polybenzoxazole (PBO), inorganic dielectric material (e.g., silicon oxide, silicon nitride, or the like), or other suitable electrically insulating materials. Materials of the fine conductive pattern FP and the fine conductive via FV may include copper, gold, nickel, aluminium, platinum, tin, combinations thereof, an alloy thereof, or another suitable conductive material.

For example, the fine conductive pattern FP may be formed over the temporary carrier 50 using a deposition process, a lithography process and an etching process, or other suitable processes. The fine conductive pattern FP may be a patterned conductive layer with fine line/space routing. Next, the fine dielectric layer FD including a plurality of openings may be formed over the temporary carrier 50 to cover the fine conductive pattern FP using, for example, a coating process, a photolithography and an etching process, or other suitable processes. The openings of the fine dielectric layer FD may expose at least the portion of the fine conductive pattern FP for electrical connection. In other embodiments, the fine dielectric layer FD is formed before the formation of the fine conductive pattern FP. A conductive material may be formed inside the openings of the fine dielectric layer FD to form the fine conductive vias FV using suitable deposition process. The term "conductive vias" may be the elements that provide electrical connection between layers and go through the plane of one or more adjacent layers. The conductive material may also be formed on the top surface of fine dielectric layer FD, and then patterned to form another level of the fine conductive pattern FP. The abovementioned steps may be performed multiple times such that the fine conductive patterns FP and the fine dielectric layers FD are alternately stacked and the fine conductive vias FV are embedded in the fine dielectric layers FD. The fine conductive vias FV may be formed to be electrically and physically connected between the fine conductive patterns FP in different layers. In some embodiments, the redistribution structure 110 is a stack of layers having fine line/space routing. It should be noted that the redistribution structure shown in FIG. 1A is merely exemplary, more levels or less levels of the redistribution structure may be formed as required by the circuit design.

The redistribution structure 110 includes a top surface 110t and a bottom surface 110b opposite to each other, where the bottom surface 110b faces towards the temporary carrier 50. The fine conductive pattern FP and the fine dielectric layer FD at the bottom surface 110b of the redistribution structure 110 may be substantially leveled. The fine conductive vias FV may be tapered towards the temporary carrier 50. For example, the fine conductive vias FV includes slanted sidewalls, and a width (or diameter) of each fine conductive via FV gradually increases in a direction from the bottom surface 110b to the top surface 110t. Alternatively, the fine conductive vias FV include vertical sidewalls with respective to the bottom surface 110b.

Continue to FIG. 1A, the bonding layer 120 is formed on the top surface 110t of the redistribution structure 110. For example, the bonding layer 120 is formed on the fine dielectric layer FD and covers the fine conductive pattern FP formed on the top surface of the fine dielectric layer FD. In some embodiments, before forming the bonding layer 120, another level of the fine dielectric layer FD is formed to cover the topmost level of the fine conductive pattern FP, so that the bonding layer 120 is formed on the fine dielectric layer FD without physically connecting the fine conductive pattern FP. A material of the bonding layer 120 may be or may include Ajinomoto build-up film (ABF), polypropylene (PP), epoxy resin, or other suitable adhesive materials. In some embodiments, compared to the release layer 51 which is temporarily bonded the redistribution structure 110 to the temporary carrier 50, the bonding layer 120 includes a layer of permanent adhesive.

Figure 1B:
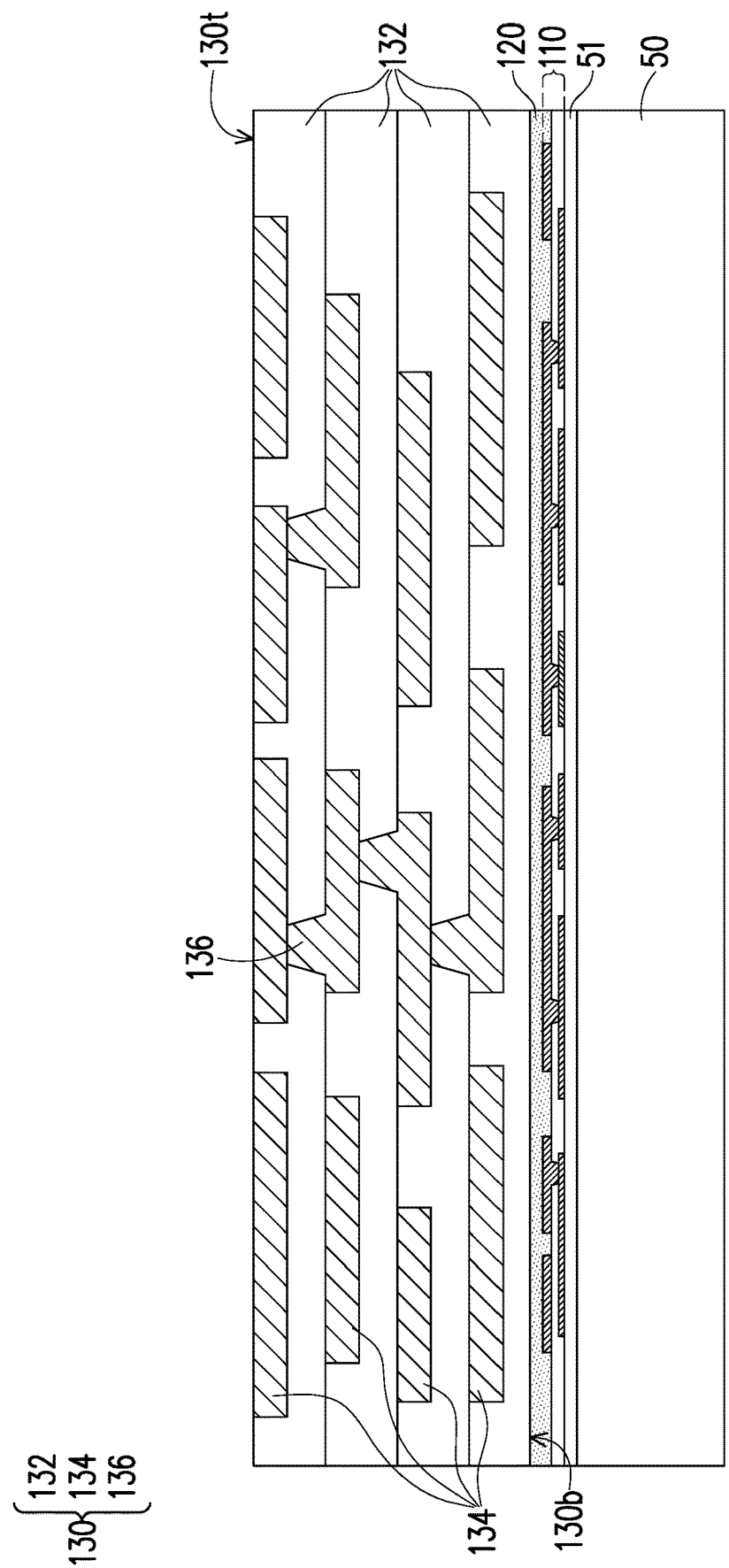

Referring to FIG. 1B, a circuit board 130 is disposed over and bonded to the redistribution structure 110 through the bonding layer 120. For example, heat and/or pressure may be applied to the bonding layer 120 so as to bond a bottom surface 130b of the circuit board 130 to the redistribution structure 110. In some other embodiments, the bonding layer 120 is initially formed on the circuit board 130 instead of the redistribution structure 110. The circuit board 130 may be or may include a single layered board, a double-layered board, a multi-layered circuit board, etc., and may be fabricated by a laminated method, a build-up method, or other suitable methods. In some embodiments, the circuit board 130 includes a wiring structure having a plurality of dielectric layers 132, a plurality of patterned wiring layers 134 stacked therewith, and a plurality of conductive vias 136 physically and electrically connected the patterned wiring layers in different levels and embedded in the dielectric layers 132. In some embodiments, the topmost level of the dielectric layers 132 covers the topmost level of the patterned wiring layers 134.

A material of the dielectric layers 132 may be or may include a prepreg, glass fiber (e.g., FR4), fiber-resin prepreg materials (e.g., a mixture of bismaleimide triazine (BT) resin and glass fiber, a mixture of epoxy resin and glass fiber (FR4)), or other suitable electrically insulating material. In some embodiments, the material the topmost level of the dielectric layers 132 at a top surface 130t of the circuit board 130 and/or the bottommost level of the dielectric layers 132 at the bottom surface 130b of the circuit board 130 may be different from the material of the intermediate level(s) of the dielectric layers 132. For example, the dielectric layers 132 at the top surface 130t and/or the bottom surface 130b may be made of resist material. In some embodiments, the topmost levels of the dielectric layers 132 and the patterned wiring layers 134 at the top surface 130t are substantially leveled.

In other embodiments, the topmost level of the dielectric layers 132 at the top surface 130t may include a plurality of recesses (not shown) exposing the underlying topmost level of the patterned wiring layers 134 (e.g., contact pads) for further connecting a signal source. The material properties of the dielectric layers 132 may include rigidity, high reliability, a small coefficient of thermal expansion (CTE), etc. In some embodiments, the material of the dielectric layers 132 is more rigid than that of the fine dielectric layer FD of the redistribution structure 110. Materials of the patterned wiring layers 134 and the conductive vias 136 may include copper, nickel, aluminum, or any other metals or alloys. For example, the patterned wiring layers 134 are the patterned copper coils. In some embodiments, the circuit board 130 is a printed circuit board (PCB).

The patterned wiring layers 134 include conductive patterns (or conductive lines, contact pads, etc.) which are coarser and thicker than the fine conductive pattern FP of the redistribution structure 110. For example, the fine conductive pattern FP of the redistribution structure 110 has line-spacing (L/S) pitches finer than the conductive patterns of the patterned wiring layers 134. In some embodiments, a dimension (e.g., height, depth, width, outer diameter, etc.) of each conductive via 136 is greater than that of the fine conductive via FV of the redistribution structure 110. The conductive vias 136 may be tapered in the same directions as the fine conductive vias FP of the redistribution structure 110. Alternatively, the conductive vias 136 are tapered in the opposing directions with respect to the fine conductive vias FP of the redistribution structure 110 or the conductive vias 136 may include substantially vertical sidewalls.

A thickness of one level of the dielectric layers 132 may be greater than that of the fine dielectric layer FD of the redistribution structure 110. The circuit board 130 and the redistribution structure 110 may be fabricated separately and may allow different design rules. For example, the redistribution structure 110 is fabricated according to integrated circuit (IC) design rules, and the circuit board 130 is fabricated according to PCB design rules. The design rules include width rule, spacing rule, enclosure rule, etc. For example, the minimum width of any shape in the IC design is much less than the minimum width of any shape in the PCB design. The layout density of the redistribution structure 110 is much finer and denser than that of the circuit board 130. In some embodiments, the line width of the fine conductive pattern FP (labelled in FIG. 1A) of the redistribution structure 110 is less than that of the patterned wiring layer 134 of the circuit board 130. The line/spacing (L/S) of the fine conductive pattern FP of the redistribution structure 110 may be finer than that of the patterned wiring layer 134 of the circuit board 130. It should be noted that the circuit board 130 illustrated in FIG. 1B is merely exemplary, and more elements (e.g., core, blind vias, through vias) may be disposed in the circuit board 130.

Figure 1C:
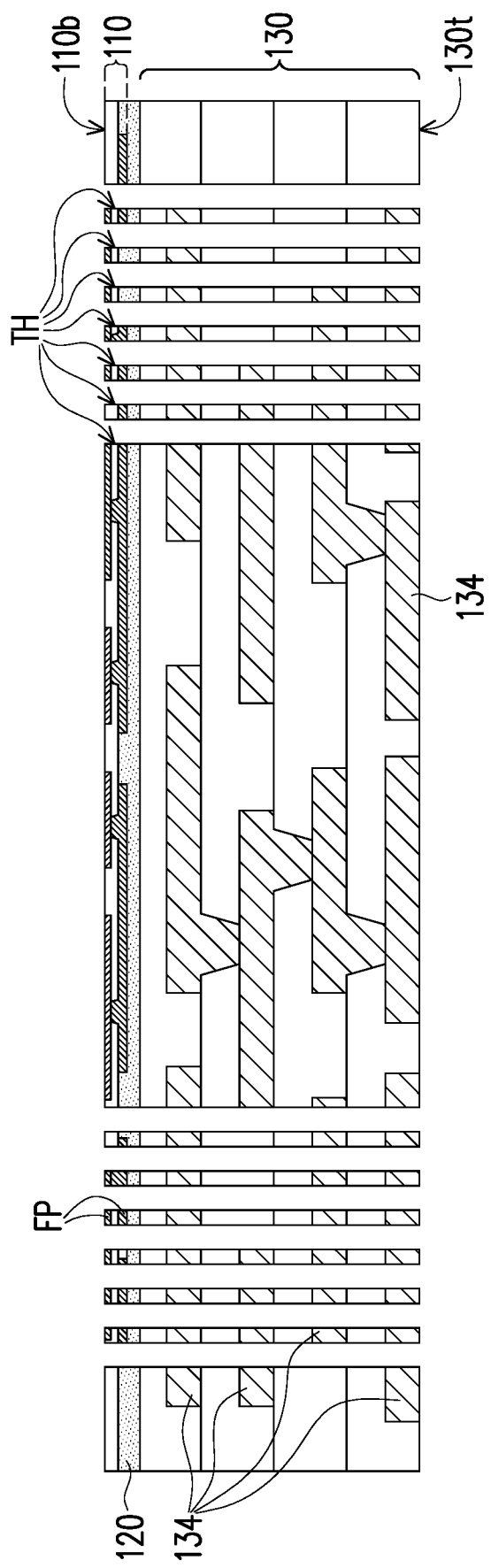
Figure 1D:
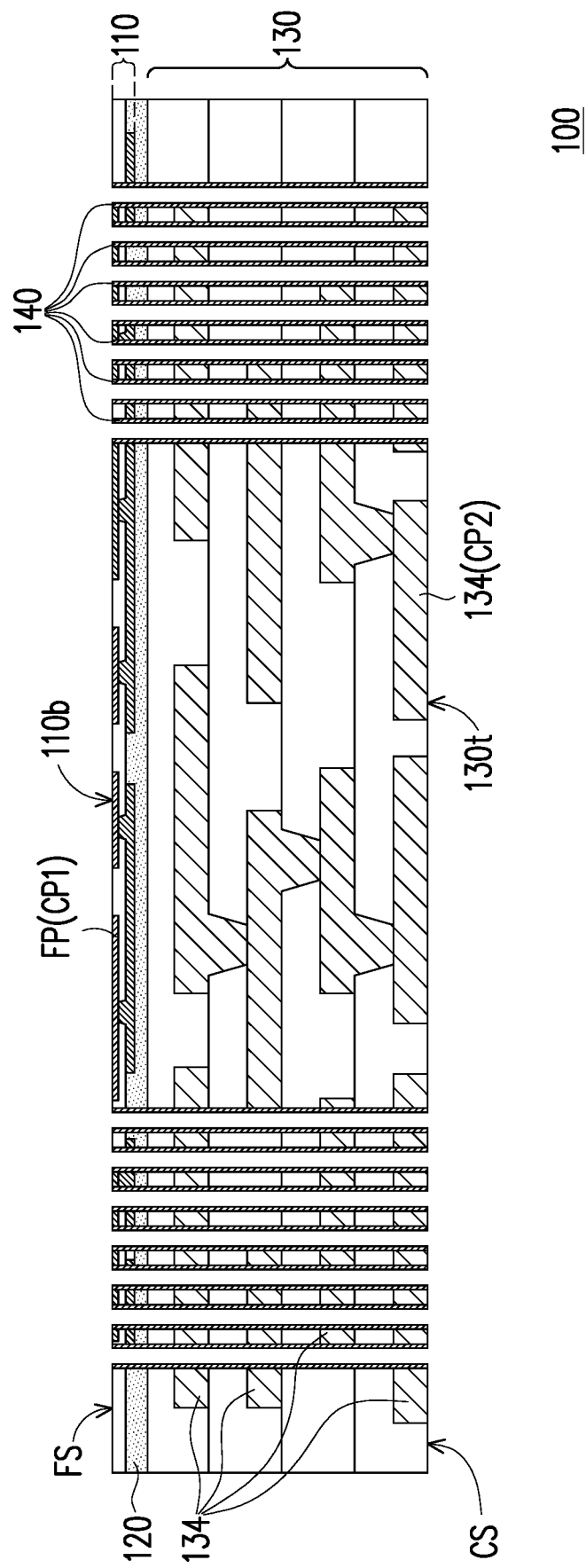

Referring to FIG. 1C and FIG. 1D, the temporary carrier 50 is removed and a plurality of conductive through vias 140 are formed to provide electrical connection between the redistribution structure 110 and the circuit board 130. For example, the temporary carrier 50 may be removed from the bottom surface 110b of the redistribution structure 110 by applying external energy to the release layer 51 located between the redistribution structure 110 and the temporary carrier 50 so as to peel off the release layer 51. Other suitable processes may be used to remove the temporary carrier 50 and the release layer 51. A cleaning process is optionally performed on the bottom surface 110b of the redistribution structure 110 to remove the residue of the release layer 51.

In some embodiments, after removing the temporary carrier 50, portions of the redistribution structure 110, the bonding layer 120, and the circuit board 130 are removed to form a plurality of through holes TH. For example, a drilling process is carried out to form the through holes TH extending through the bottom surface 110b of the redistribution structure and the top surface 130t of the circuit board 130 shown in FIG. 1B. In some embodiments, at least portions of the fine conductive pattern FP of the redistribution structure 110 and the patterned wiring layers 134 of the circuit board 130 are laterally exposed by the through holes TH.

Subsequently, a conductive material (e.g., copper, gold, nickel, aluminium, platinum, tin, combinations thereof, an alloy thereof, etc.) may be formed inside the through holes TH to form the conductive through vias 140 using plating, sputtering, or other suitable deposition process. Alternatively, the temporary carrier 50 is removed after forming the conductive through vias 140 as will be described later in other embodiments. After forming the conductive through vias 140, the redistribution structure 110 is electrically coupled to the circuit board 130 through the conductive through vias 140. In some embodiments, the conductive material is conformally plated on the inner sidewalls of the though holes TH so that the conductive through vias 140 are hollow. Alternatively, the though holes TH are filled with the conductive material so that the conductive through vias 140 are solid pillars. Up to here, the manufacturing process of a space transformer 100 is substantially complete.

The space transformer 100 includes a fine circuitry side FS and a coarse circuit side CS opposite to each other. The redistribution structure 110 having the fine conductive pattern FP is located at the fine circuitry side FS, the circuit board 130 having the patterned wiring layer 134 is located at the coarse circuit side CS. The conductive through vias 140 providing vertical conductive paths are interconnected the redistribution structure 110 and the circuit board 130 and extend between the fine circuitry side FS and the coarse circuit side CS. The fine conductive pattern FP may include fine contact pads CP1 distributed at the bottom surface 110b and the patterned wiring layer 134 may include coarse contact pads CP2 distributed at the top surface 130t. The fine contact pads CP1 are flat since the fine conductive pattern FP is formed over the temporary carrier 50.

The distribution layout of the fine contact pads CP1 of the redistribution structure 110 may be denser than the distribution layout of the coarse contact pads CP2. For example, given a certain area of the space transformer, a pitch between the adjacent fine contact pads CP1 is finer than a pitch between the coarse contact pads CP2. In some embodiments, the fine contact pads CP1 of the redistribution structure 110 are capable of mating with fine-pitched probing pins which are used to probe a semiconductor wafer, and the coarse contact pads CP2 of the circuit board 130 are capable of corresponding to a signal source carrier (e.g., PCB).

Figure 2A:
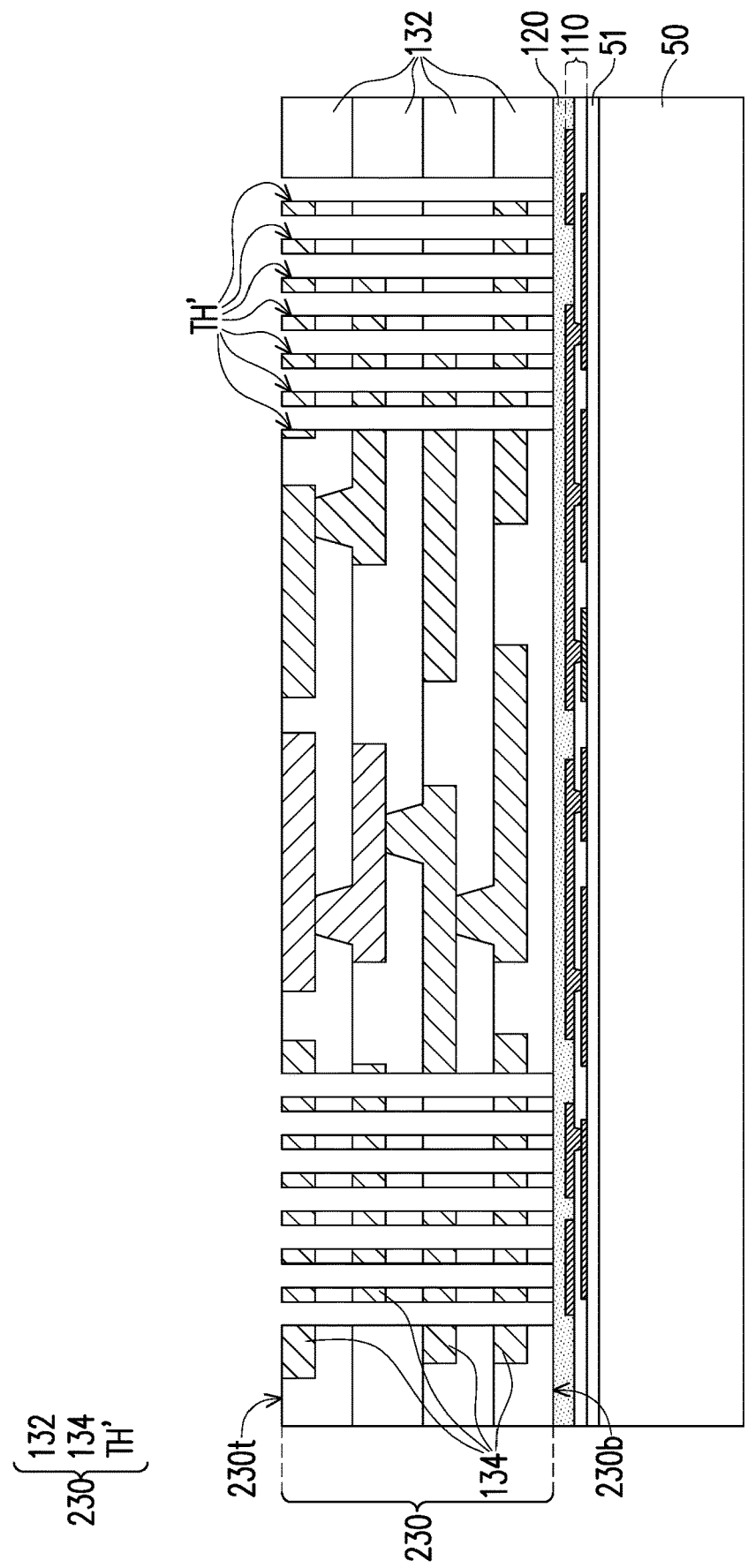
FIG. 2A to FIG. 2C are schematic cross-sectional views illustrating a manufacturing method of a space transformer according to some embodiments of the invention.
Figure 2B:
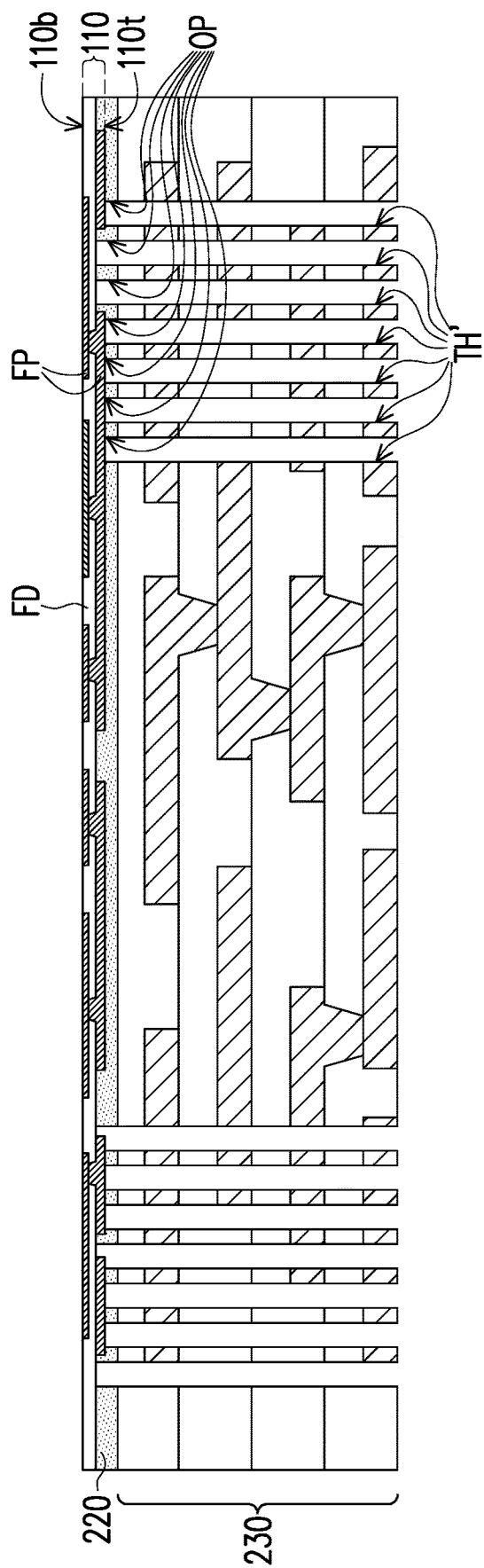
Figure 2C:
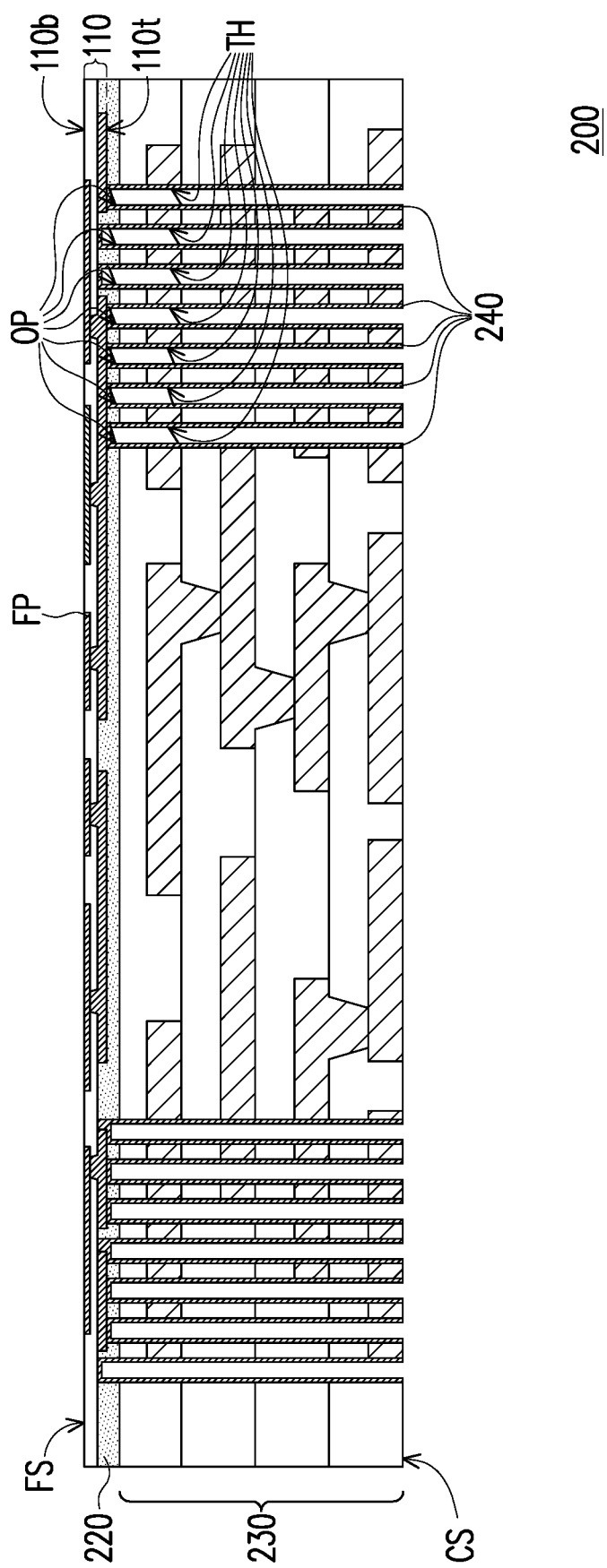

FIG. 2A to FIG. 2C are schematic cross-sectional views illustrating a manufacturing method of a space transformer according to some embodiments of the invention. The identical or similar numbers refer to the identical or similar elements throughout the drawings, and detail thereof is not repeated. Referring to FIG. 2A, the circuit board 230 is bonded to the redistribution structure 110 using the bonding layer 120 with the temporary carrier 50 disposed underneath the redistribution structure 110 for support. The circuit board 230 is similar to the circuit board described in FIG. 1B, and the difference therebetween lies in that the circuit board 230 having a plurality of through holes TH' formed therein. For example, the through holes TH' are pre-drilled before bonding the circuit board 230 to the redistribution structure 110. The through holes TH' may penetrate through the dielectric layers 132 and extend from the top surface 230t of the circuit board 230 to the bottom surface 230b of the circuit board 230. In some embodiments, at least portions of the patterned wiring layers 134 are laterally exposed by the through holes TH'. Since the through holes TH' do not extend through the redistribution structure 110, the through holes TH' may be referred to as blind holes. In some embodiments, when the bonding process is performed, heat and/or pressure may be applied to the bonding layer 120. After bonding the circuit board 230, portions of the bonding layer 120 are revealed by the through holes TH'.

Referring to FIG. 2B, after bonding the circuit board 230, the temporary carrier 50 is removed to expose the bottom surface 110b of the redistribution structure 110. For example, the external energy such as UV laser, visible light or heat, may be applied to the release layer 51 so that the redistribution structure 110 and the temporary carrier 50 are separated from each other. Other suitable processes may be used to remove the temporary carrier 50 and the release layer 51. A cleaning process is optionally performed on the bottom surface 110b of the redistribution structure 110 to remove the residue of the release layer 51.

In some embodiments, portions of the bonding layer 120 corresponding to the through holes TH' so as to form a patterned bonding layer 220 with a plurality of openings OP. For example, plasma etching, chemical etching, or other suitable removal process may be performed on the bonding layer 120 until the fine conductive pattern FP and/or the fine dielectric layer FD at the top surface 110t of the redistribution structure 110 is exposed. In some embodiments, the through holes TH' of the circuit board 230 are in communicate with the openings OP of the patterned bonding layer 220, and at least a portion of the fine conductive pattern FP is exposed by the openings OP and the corresponding through holes TH' for further electrical connection. In other embodiments, the temporary carrier 50 is removed after forming the openings OP of the patterned bonding layer 220.

Referring to FIG. 2C, a plurality of conductive through vias 240 may be formed inside the through holes TH' of the circuit board 230 and the corresponding openings OP of the patterned bonding layer 220. The forming process of the conductive through vias 240 is similar to that of the conductive through vias 140 described in FIG. 1D. Up to here, the manufacturing process of a space transformer 200 is substantially complete.

The space transformer 200 includes a fine circuitry side FS and a coarse circuit side CS opposite to each other. The redistribution structure 110 having the fine conductive pattern FP is located at the fine circuitry side FS, the circuit board 230 having the patterned wiring layer 134 is located at the coarse circuit side CS, and the conductive through vias 240 providing vertical conductive paths to interconnect the redistribution structure 110 and the circuit board 230 extend between the fine circuitry side FS and the coarse circuit side CS. In some embodiments, the conductive through vias 240 are not penetrating through the redistribution structure 110, but connected to the fine conductive pattern FP at the top surface of the redistribution structure 110. The conductive through vias 240 may be referred to as conductive blind vias. In some embodiments, part of the conductive through vias 240 may be formed on the inner sidewalls of the openings OP of the patterned bonding layer 220.

Figure 3A:
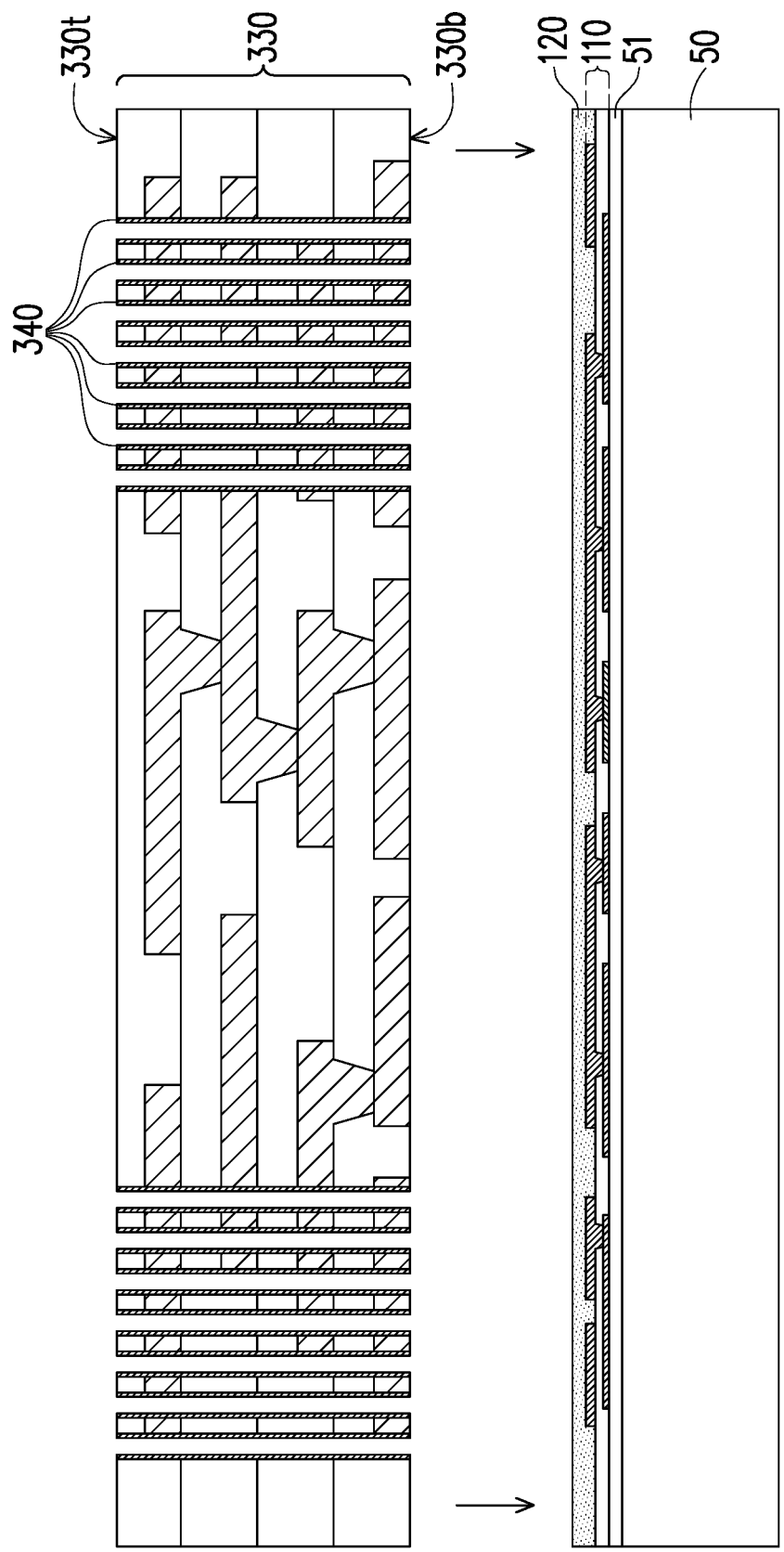
FIG. 3A and FIG. 3B are schematic cross-sectional views illustrating a manufacturing method of a space transformer according to some embodiments of the invention.
Figure 3B:
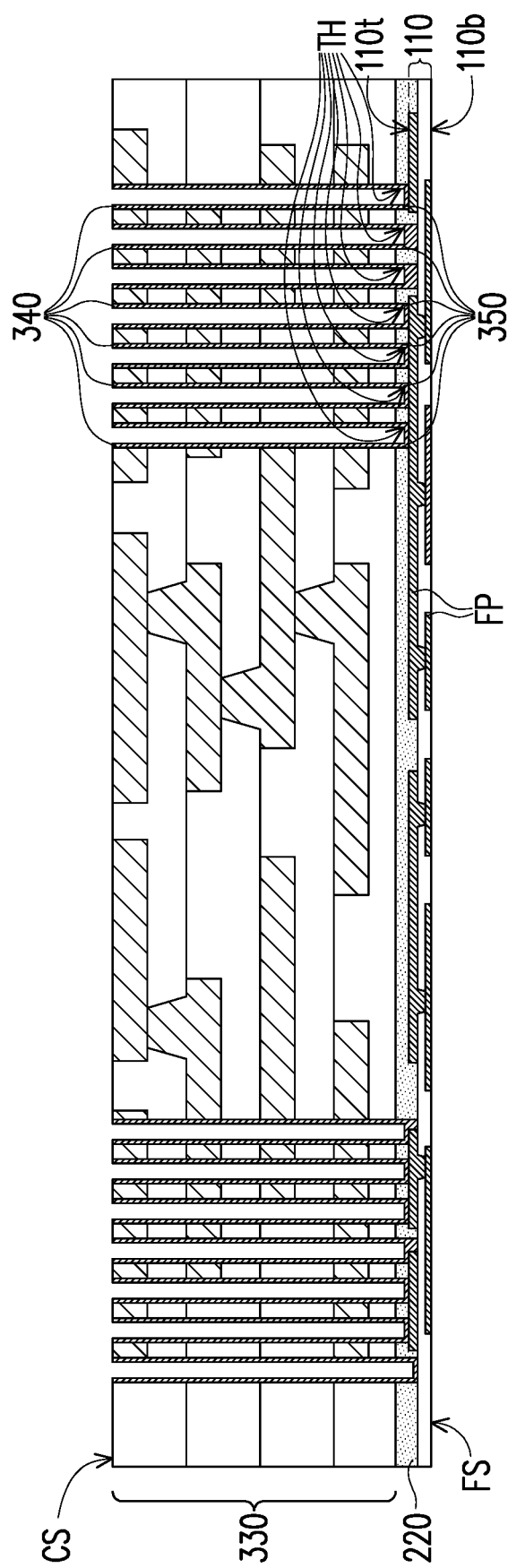

FIG. 3A and FIG. 3B are schematic cross-sectional views illustrating a manufacturing method of a space transformer according to some embodiments of the invention. The identical or similar numbers refer to the identical or similar elements throughout the drawings, and detail thereof is not repeated. Referring to FIG. 3A, the redistribution structure 110 is formed over the temporary carrier 50, and the bonding layer 120 is formed on the redistribution structure 110. A circuit board 330 is provided with a plurality of conductive through vias 340 pre-formed in the through holes. For example, before bonding, the conductive through vias 340 are formed on the circuit board 330 as described in FIG. 1B using drilling, plating, or other suitable process, so that the conductive through vias 340 extending from the top surface 330t of the circuit board 330 to the bottom surface 330b of the circuit board 330 are formed. In some embodiments, the circuit board 330 providing with the conductive through vias 340 may be separately fabricated from the redistribution structure 110 and the bonding layer 120 formed thereon.

Referring to FIG. 3B, the circuit board 330 providing with the conductive through vias 340 may be bonded to the redistribution structure 110 through the bonding layer 120. In some embodiments, portions of the bonding layer 120 corresponding to the conductive through vias 340 are removed to form the patterned bonding layer 220 with the openings exposing the underlying fine conductive pattern FP of the redistribution structure 110. The conductive material may be formed inside the openings of the patterned bonding layer 220 to form conductive features 350 which are physically and electrically connected to the conductive through vias 340 and the fine conductive pattern FP of the redistribution structure 110. For example, the redistribution structure 110 and the circuit board 330 are electrically coupled through the conductive through vias 340 and the conductive features 350. In some embodiments, the conductive through vias 340 are pre-formed on the circuit board 330, thereby facilitating forming the conductive features 350 by plating.

In other embodiments, the patterned bonding layer 220 with the openings is formed before bonding the circuit board 330, and conductive pastes may be formed in the openings of the patterned bonding layer 220 to form the conductive features 350, and then the circuit board 330 providing with the conductive through vias 340 is disposed on the conductive features 350 and the patterned bonding layer 220. Alternatively, the patterned bonding layer 220 with the openings is formed before bonding the circuit board 330, and the conductive features 350 made of conductive pastes may be provided on the bottom surface of the circuit board 320 and correspond to the conductive through vias 340 such that after bonding the circuit board, the conductive features 350 is connected the conductive through vias 340 to the redistribution structure 110 through the conductive features 350. Up to here, the manufacturing process of a space transformer 300 having the fine circuitry side FS and the coarse circuit side CS is substantially complete.

Figure 4:
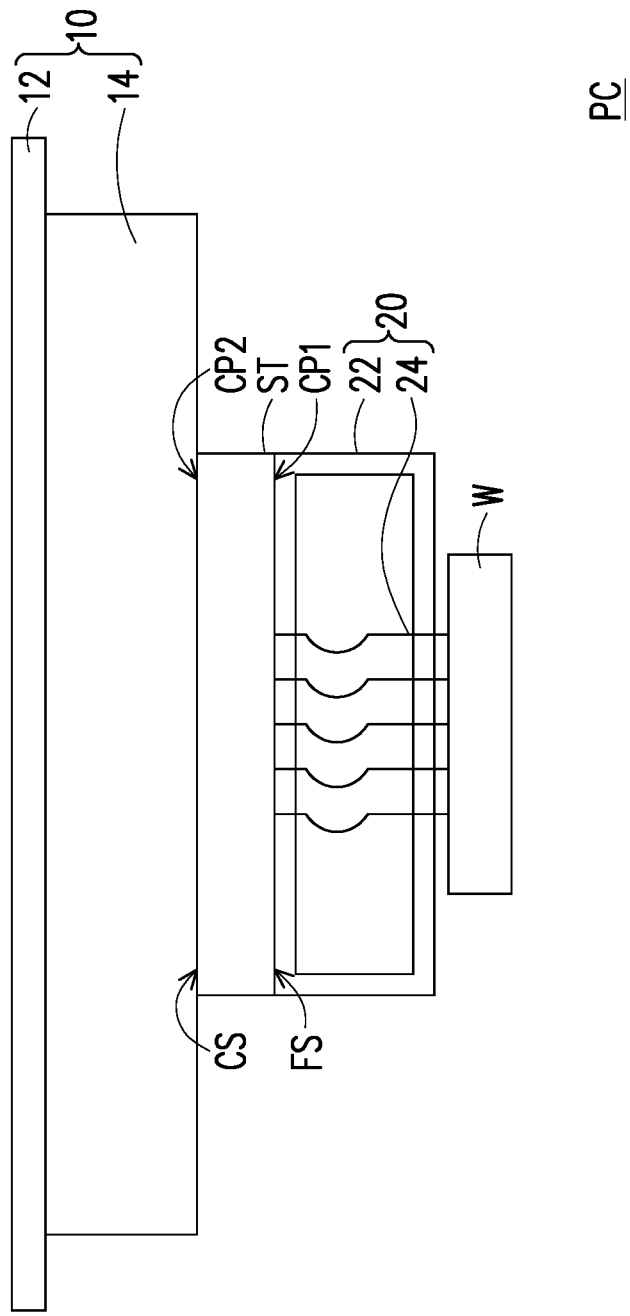
FIG. 4 is a schematic cross-sectional view illustrating an application of a space transformer according to some embodiments of the invention.

FIG. 4 is a schematic cross-sectional view illustrating an application of a space transformer according to some embodiments of the invention. Referring to FIG. 4, a testing apparatus PC including a space transformer ST disposed therein is provided. In some embodiments, the testing apparatus PC is a probe card for probing and testing a semiconductor wafer W. For example, the testing apparatus PC includes a signal source carrier 10, a probe head 20 including a mounting ring 22 and a plurality of testing probes 24, and the space transformer ST interposed between the signal source carrier 10 and the probe head 20. In some embodiments, the signal source carrier 10 includes a stiffener 12 and a testing PCB 14 carried by the stiffener 12. The testing PCB 14 may serve as the signal source for providing the signal. The signal from the testing PCB 14 may be transmitted to the testing probes 24 through the space transformer ST.

The space transformer ST includes the fine contact pads CP1 located at the fine circuitry side FS, and the coarse contact pads CP2 located at the coarse circuitry side CS. The fine circuitry side FS of the space transformer ST faces towards the semiconductor wafer W and the coarse circuitry side CS of the space transformer ST faces toward the signal source carrier 10. For example, the fine contact pads CP1 located at the fine circuitry side FS are connected to the testing probes 24 of the probe head 20 and the coarse contact pads CP2 located at the coarse circuitry side CS are connected to the testing PCB 14 of the signal source carrier 10. The fine circuitry side FS of the space transformer ST may be viewed as the probe side and the coarse circuitry side CS of the space transformer ST may be viewed as the signal source side. The space transformer ST disposed between the signal source carrier 10 and the probe head 20 may be any one of the aforementioned space transformer (e.g., the space transformer 100 described in conjunction with FIG. 1D, the space transformer 200 described in conjunction with FIG. 2C, the space transformer 300 described in conjunction with FIG. 3B). It should be noted that the testing apparatus PC illustrated in FIG. 4 is merely exemplary. In some embodiments, the coarse contact pads CP2 located at the coarse circuitry side CS of the space transformer ST are connected to the testing PCB 14 through solder balls (not shown). The testing probes 24 may be provided with fine-pitch spacing for probing the testing pads (not shown) disposed on the semiconductor wafer W.

Based on the above, the space transformer includes the fine contact pads of the redistribution structure formed according to the IC design rule such that the probe side of the space transformer may meet the requirements of fine-pitch spacing of the testing probes which are used to probe or test the semiconductor wafer. The space transformer includes the coarse contact pads of the circuit board formed according to the PCB design rules such that the signal source side of the space transformer can mate with the testing PCB for transmitting the signal to the probe side. In addition, the conductive through vias provide vertical conductive paths in the space transformer, thereby shortening signal length and minimizing a noise between operations so as to improve a signal performance of the testing apparatus.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A space transformer for connecting a signal source and probing a semiconductor wafer, the space transformer comprising:
 a circuit board comprising a wiring structure, the wiring structure comprising a plurality of dielectric layers and a plurality of patterned wiring layers alternately stacked with the dielectric layers, a plurality of first contact pads of the patterned wiring layers configured to connect the signal source;
 a redistribution structure bonded to the circuit board and comprising a plurality of second contact pads, the second contact pads configured to probe the semiconductor wafer, the redistribution structure being thinner than the circuit board, wherein a pitch of the adjacent second contact pads is finer than that of the adjacent first contact pads; and
 a conductive through via penetrating through the circuit board and providing a vertical conductive path between the circuit board and redistribution structure, and the conductive through via being laterally covered by the dielectric layers of the wiring structure and being laterally and physically in contact with the patterned wiring layers of the wiring structure.

2. The space transformer according to claim 1, wherein the redistribution structure further comprises a patterned dielectric layer partially covering the second contact pads, and an outer surface of the patterned dielectric layer is substantially coplanar with outer surfaces of the second contact pads.

3. The space transformer according to claim 1, wherein the wiring structure of the circuit board comprises a first conductive via connected to the first contact pads, the redistribution structure comprises a second conductive via connected to the second contact pads, and a dimension of the first conductive via of the circuit board is greater than that of the second conductive via of the redistribution structure.

4. The space transformer according to claim 3, wherein a width of the second conductive via of the redistribution structure increases in a direction toward the circuit board.

5. The space transformer according to claim 1, further comprising:
 a bonding layer disposed between the circuit board and the redistribution structure, wherein the first contact pads of the circuit board and the second contact pads of the redistribution structure are disposed at two opposing sides distal to the bonding layer.

6. The space transformer according to claim 5, wherein the conductive through via extends through the bonding layer to be in contact with the redistribution structure.

7. The space transformer according to claim 1, wherein the conductive through via extends through the redistribution structure.

8. A manufacturing method of a space transformer for connecting a signal source and probing a semiconductor wafer, comprising:
 bonding a circuit board to a redistribution structure through a bonding layer, wherein the circuit board comprises a plurality of dielectric layers and a plurality of patterned wiring layers alternately stacked with the dielectric layers, a plurality of first contact pads of the patterned wiring layers of the circuit board is formed according to a first design rule and a plurality of second contact pads of the redistribution structure is formed according a second design rule, a dimension of each of the first contact pads is greater than a dimension of each of the second contact pads, the first contact pads of the circuit board are configured to connect the signal source, and the second contact pads of the redistribution structure are configured to probe the semiconductor wafer; and electrically coupling the redistribution structure to the circuit board by a vertical conductive path between the circuit board and redistribution structure, wherein the vertical conductive path is laterally covered by the dielectric layers of the circuit board and is laterally and physically in contact with the patterned wiring layers of the circuit board.

9. The manufacturing method of claim 8, wherein electrically coupling the redistribution structure to the circuit board comprises:

after bonding the circuit board to the redistribution structure, forming a through hole on the circuit board, and the through hole passing through the bonding layer and the redistribution structure; and forming a conductive material in the through hole to form the vertical conductive path between the circuit board and redistribution structure.

10. The manufacturing method of claim 8, wherein electrically coupling the redistribution structure to the circuit board comprises:

after bonding the circuit board to the redistribution structure, forming a blind hole on the circuit board and the bonding layer to expose at least a portion of the redistribution structure; and forming a conductive material in the blind hole to be in contact with the portion of the redistribution structure so as to form the vertical conductive path between the circuit board and redistribution structure.

11. The manufacturing method of claim 8, wherein electrically coupling the redistribution structure to the circuit board comprises:

providing the circuit board with a conductive through via formed therein before bonding the circuit board to the redistribution structure, wherein after bonding the circuit board to the redistribution structure, and the conductive through via is electrically connected to the redistribution structure.

12. The manufacturing method of claim 8, further comprising:

forming the second contact pads of the redistribution structure and a patterned dielectric layer of the redistribution structure on a temporary carrier; and after bonding the circuit board to the redistribution structure, removing the temporary carrier to expose the second contact pads and the patterned dielectric layer, wherein exposed surfaces of the second contact pads and the patterned dielectric layer are substantially leveled.

* * * * *